US009454170B2

(12) United States Patent
Bhattad et al.

(10) Patent No.: US 9,454,170 B2
(45) Date of Patent: Sep. 27, 2016

(54) LOAD TRANSIENT, REDUCED BOND WIRES FOR CIRCUITS SUPPLYING LARGE CURRENTS

(71) Applicant: Dialog Semiconductor GmbH, Kircheim/Teck-Nabern (DE)

(72) Inventors: Ambreesh Bhattad, Swindon (GB); Ludmil Nikolov, Chippenham (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 14/996,705

(22) Filed: Jan. 15, 2016

(65) Prior Publication Data

US 2016/0132064 A1 May 12, 2016

Related U.S. Application Data

(62) Division of application No. 13/652,996, filed on Oct. 16, 2012, now Pat. No. 9,239,585.

(51) Int. Cl.
*G05F 1/00* (2006.01)
*H03B 1/00* (2006.01)
*G05F 1/575* (2006.01)

(52) U.S. Cl.
CPC .................................... *G05F 1/575* (2013.01)

(58) Field of Classification Search
CPC ... H02M 3/156; H02M 3/1588; G05F 1/575; G05F 1/56; G05F 1/565
USPC ....... 323/269, 273, 265, 282, 280, 281, 270, 323/274, 277, 315, 312, 314, 316, 317; 327/108–112; 326/82, 83
See application file for complete search history.

(56) References Cited

U.S. PATENT DOCUMENTS

| | | | | |
|---|---|---|---|---|
| 7,129,686 | B1 | 10/2006 | Huang | |
| 8,129,962 | B2 | 3/2012 | Xie et al. | |
| 8,912,772 | B2 | 12/2014 | Childs | |
| 2006/0273771 | A1 * | 12/2006 | van Ettinger ........... | G05F 1/575 323/273 |
| 2010/0156362 | A1 | 6/2010 | Xie | |

* cited by examiner

*Primary Examiner* — Lincoln Donovan
*Assistant Examiner* — Thomas Skibinski
(74) *Attorney, Agent, or Firm* — Saile Ackerman LLC; Stephen B. Ackerman

(57) ABSTRACT

Circuits and methods to improve dynamic load transient performance of circuits supplying high current and having parasitic resistances are disclosed. These circuits comprise e.g. LDOs, amplifiers or buffers. The circuits and methods are characterized by including parasitic resistances, caused by bond wires, metallization of pass devices, and substrate routings, in a loop for fast transient response. Furthermore the circuits comprise a stabilization circuit within said loop and a separate pad for said loop.

19 Claims, 7 Drawing Sheets

200

LOAD TRANSIENT, REDUCED BOND WIRES FOR CIRCUITS SUPPLYING LARGE CURRENTS

This is a divisional application of U.S. patent application Ser. No. 13/652,996 filed on Oct. 16, 2012, which is herein incorporated by reference in its entirety, and assigned to a common assignee.

RELATED APPLICATION

This application is related to the following U.S. patent application: DS10-013, titled “LDO with improved stability”, Ser. No. 13/066,598, filing date Apr. 19, 2011, which is assigned to the same assignee, and which is hereby incorporated by reference in its entirety.

BACKGROUND (1) Technical Field

The present document relates to low dropout (LDO) regulator and similar circuits. In particular, the present document relates to reducing contributions to voltage drops due to bond wire resistance etc. degrading load transient performance of circuits supplying high currents, i.e. any current higher than 100 mA.

(2) Background of the Disclosure

Integrated circuit packages of circuits providing large output currents such as e.g. low drop-out (LDO) regulators, amplifiers or buffers have shrunk significantly in the last years and usually two bond-wires were used to reduce bond-wire resistances.

Furthermore the demand for higher supply currents has increased significantly with an increase of functionality of circuit packages.

It is a challenge for engineers to design circuits supplying high currents to minimize the contribution in voltage drop due to bond wire resistance, metallization resistance and substrate routing resistance degrading load transient performance.

SUMMARY

A principal object of the present disclosure is to improve dynamic load transient performance of circuits supplying high currents such as LDOs, amplifiers, or buffers.

A further object of the disclosure is to avoid parasitic contributions at the output of circuits supplying high currents such as LDOs, amplifiers, or buffers due to bond wire voltage drop, metallization resistance of pass device, and substrate routing.

A further object of the disclosure is to avoid instability due to parasitics.

A further object of the disclosure is to use one bond wire.

A further object of the disclosure is to include parasitics within a fast regulation loop.

A further object of the disclosure is to use a stabilization circuit within the fast regulation loop.

In accordance with the objects of this disclosure a method to improve dynamic load transient performance of circuits supplying high current has been achieved. The method disclosed, comprises the following steps: (1) providing an electronic circuit supplying high currents and having parasitic resistances, (2) including parasitic resistances in a separate loop for fast loop response, (3) implementing stabilizing circuit with said fast loop response, and (4) deploying separate pad for the fast loop response connected to feedback voltage VFB.

In accordance with the objects of this disclosure a circuit to improve dynamic load transient performance of circuits supplying high current and having parasitic resistances has been achieved. The circuit disclosed comprises: a separate loop for fast transient response including the parasitic resistances, a separate pad for the loop for fast transient response, and a stabilizing circuit connected to said loop for fast transient response.

BRIEF DESCRIPTION OF THE DRAWINGS

In the accompanying drawings forming a material part of this description, there is shown.

DESCRIPTION OF THE PREFERRED EMBODIMENTS

Methods and circuits to improve dynamic load transient performance of circuits supplying high currents such as LDOs, amplifiers, or buffers by overcoming degradations caused by voltage drops due to resistances of bond wires, metallization of pass device, and substrate routing are disclosed.

Figure 1:
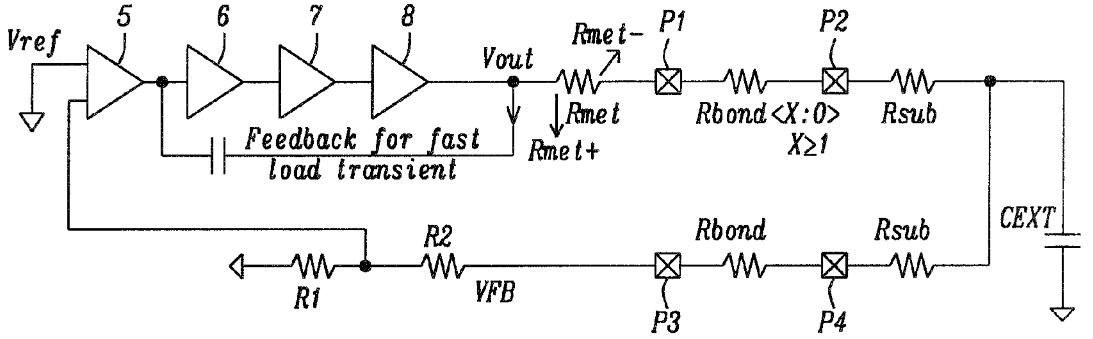
FIG. 1 shows the basic elements of a first implementation of a circuit using two bond-wires including resistances of bond wires, metallization, and substrate routings.

FIG. 1 shows the basic elements of a first implementation of a circuit using two bond wires including resistances of bond wires, metallization, and substrate routings.

The circuit of FIG. 1 illustrates resistances of pass device metallization Rmet 1, Rbond 2 of the two bond wires, and substrate routings Rsub 3. Actually the circuit of FIG. 1 shows Rbond<x:0>, which means “x” bond wires in parallel. Furthermore FIG. 1 shows two pads P1/P3 and two bond fingers P2/P4, an external capacitor Cext, and a feedback loop 4 for fast load transient. Moreover the exemplary circuit of FIG. 1 shows an LDO having a voltage divider R1/R2 providing feedback to a differential amplifier 5, receiving a reference voltage Vref as a second input, a number of buffer amplifier stages 6, 7 and a pass device 8. The fast loop is sensed at Rmet+.

Using one bond wire instead of two bond wires for supplying of e.g. 300 mA, compared to supplying 150 mA in previous connection would double the voltage drop in bond wires, and double the contributions in voltage drop due to increase in the metallization resistance (as the pass device size has doubled).

The disadvantage of the implementation shown in FIG. 1 when one bond wire is used is a low dynamic load transient performance of e.g. a LDO due to parasitic contributions due to:

bond wire voltage drop;

Metallization resistance of pass device; and

Substrate routing.

Including the parasitics would lead to instabilities without a stabilization circuit.

Figure 2:
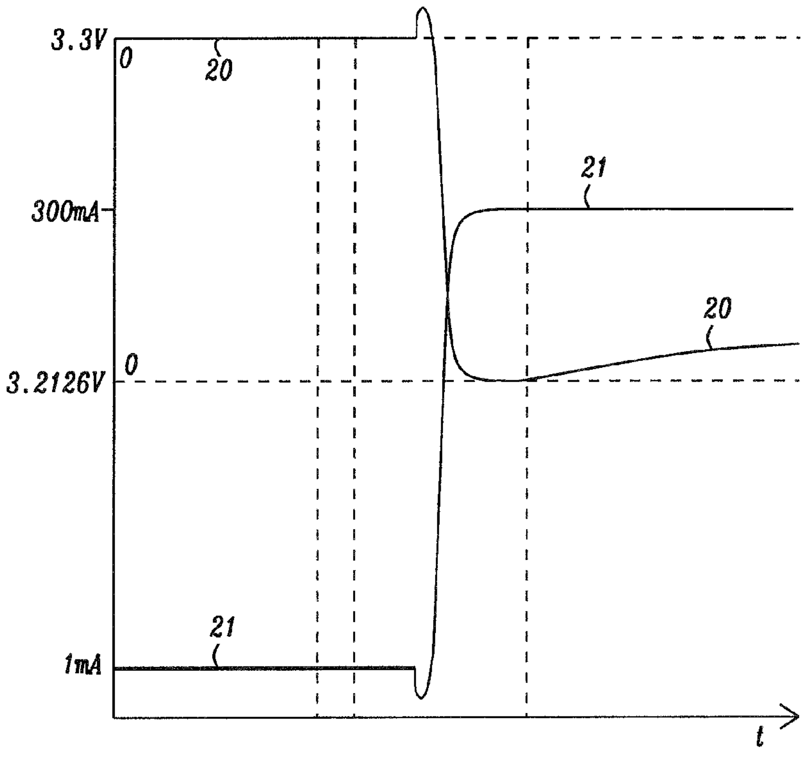
FIG. 2 shows a plot of a LDO response to a load transient from 1 mA to 300 mA according to the circuit design shown in FIG. 1.

FIG. 2 shows a plot of a LDO response to a load transient from 1 mA to 300 mA according to the circuit design shown in FIG. 1, wherein one bond wire is used.

The dip in the output voltage 20 to the load transient 21 from 1 mA to 300 mA is 84 mV. Such a dip is an impediment for many applications.

Figure 3A:
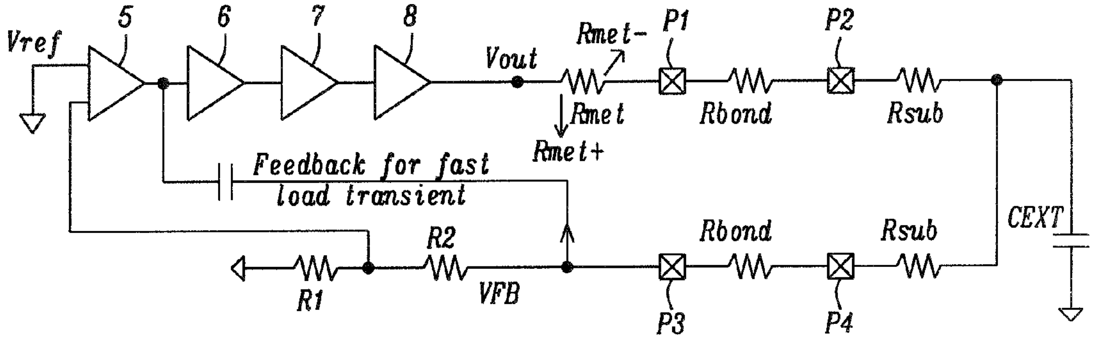
FIG. 3*a* illustrates an improved implementation of the disclosure applied for example to a LDO.

FIG. 3*a* illustrates an improved implementation of the disclosure applied for example to a LDO again. This implementation is characterized by including the parasitics, caused by resistances of bond wires, metallization and substrate routings, in the fast regulation loop.

The objective of the circuit of FIG. 3*a* is to improve the dynamic load transient performance of a circuit supplying high currents, e.g. a LDO, by avoiding parasitic contributions due to resistances of bond wire, metallization of pass device, and substrate routing and using one bond wire.

The circuit of FIG. 3*a* has only resistance Rbond between P1 and P2, illustrating use of one bond wire only.

Figure 4A:
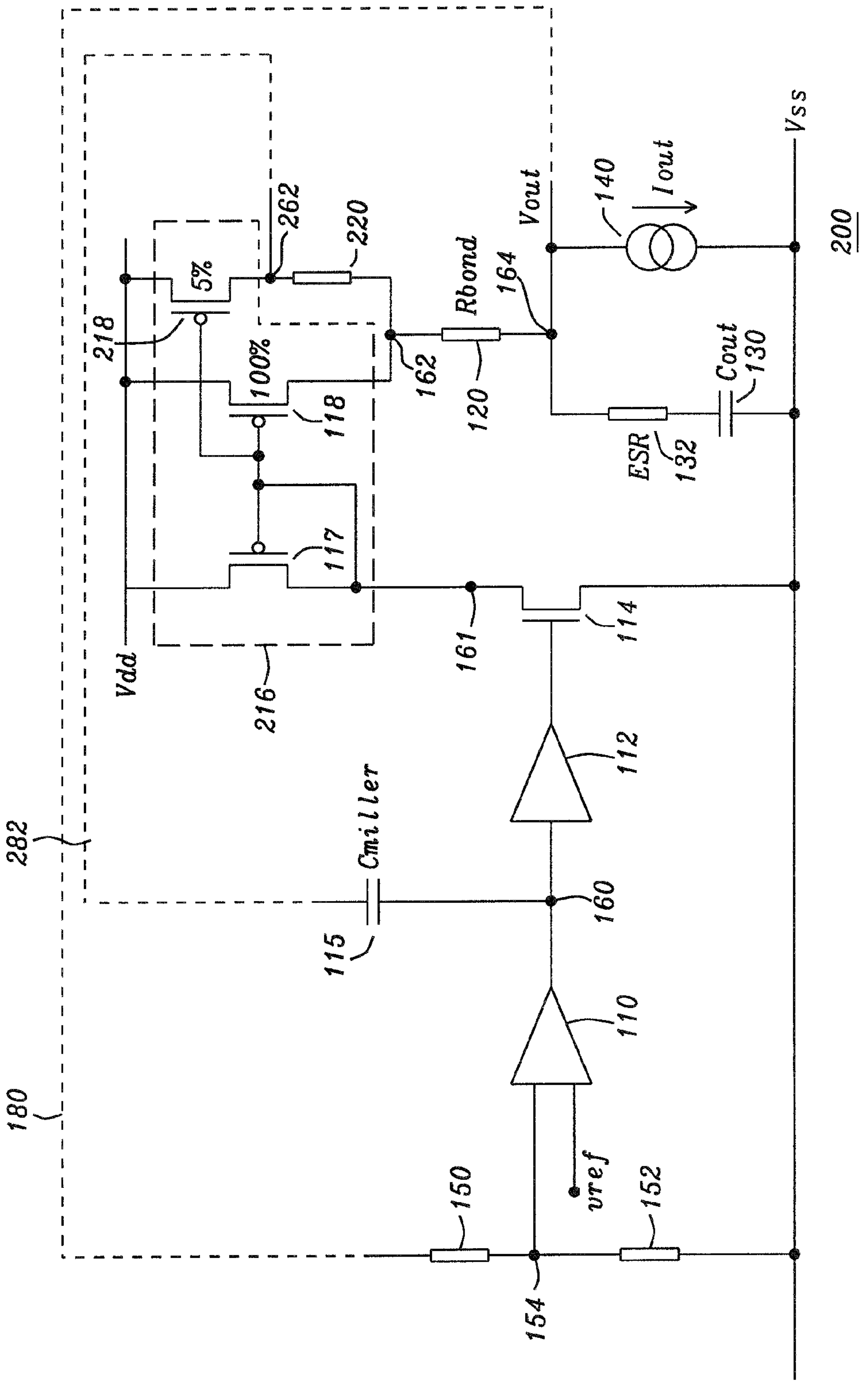
FIG. 4*a* shows a stabilization circuit as disclosed in the patent application Ser. No. 13/066,598.

For this implementation a stabilization circuit, as e.g. disclosed in U.S. patent application docket number DS10-013, titled "LDO with improved stability", Ser. No. 13/066,598, filing date Apr. 19, 2011, may be used. FIG. 4*a* shows this stabilization circuit as disclosed in the patent application Ser. No. 13/066,598.

The stabilization circuit of FIG. 4*a* shows an additional pass device in parallel with the main pass device. This additional pass device 218 would have typically about 5% of the existing 100% channel width of the main pass 118 device, but pass device 218 may range from between about 1 to 10% but preferably ranges from between about 0.5 to 15% of the existing channel width of the main pass device. The additional pass device 218 will share the power connection and the gate connection. However, between the drain and the output of the LDO a resistor 220 of typically about 2Ω is deployed which may range from between about 1 to 5 Ω but preferably ranges from between about 0.5 to 10Ω. The Miller capacitor is now connected to the drain of this new pass device. This means the Miller capacitor sees a much greater ESR, and so it amplifies the fast feedback loop gain, moving the zero node back within the bandwidth. The main pass device 118 still has low ESR, and so the drop-out performance remains unchanged. In this case the phase-margin now exceeds the previous 100 mΩ ESR environment.

Again referring to FIG. 4*a*, a current mirror stage 216 uses a third and smaller current mirror PMOS transistor 218 as additional pass device. Furthermore the drain of additional pass device 218 is coupled via node 262 to a small resistor 220 which in turn is coupled to output node 162. A new fast feedback loop 282 is coupled from node 262 via capacitor (Cmiller) 115 to node 160, the input to buffer 112.

Figure 3B:
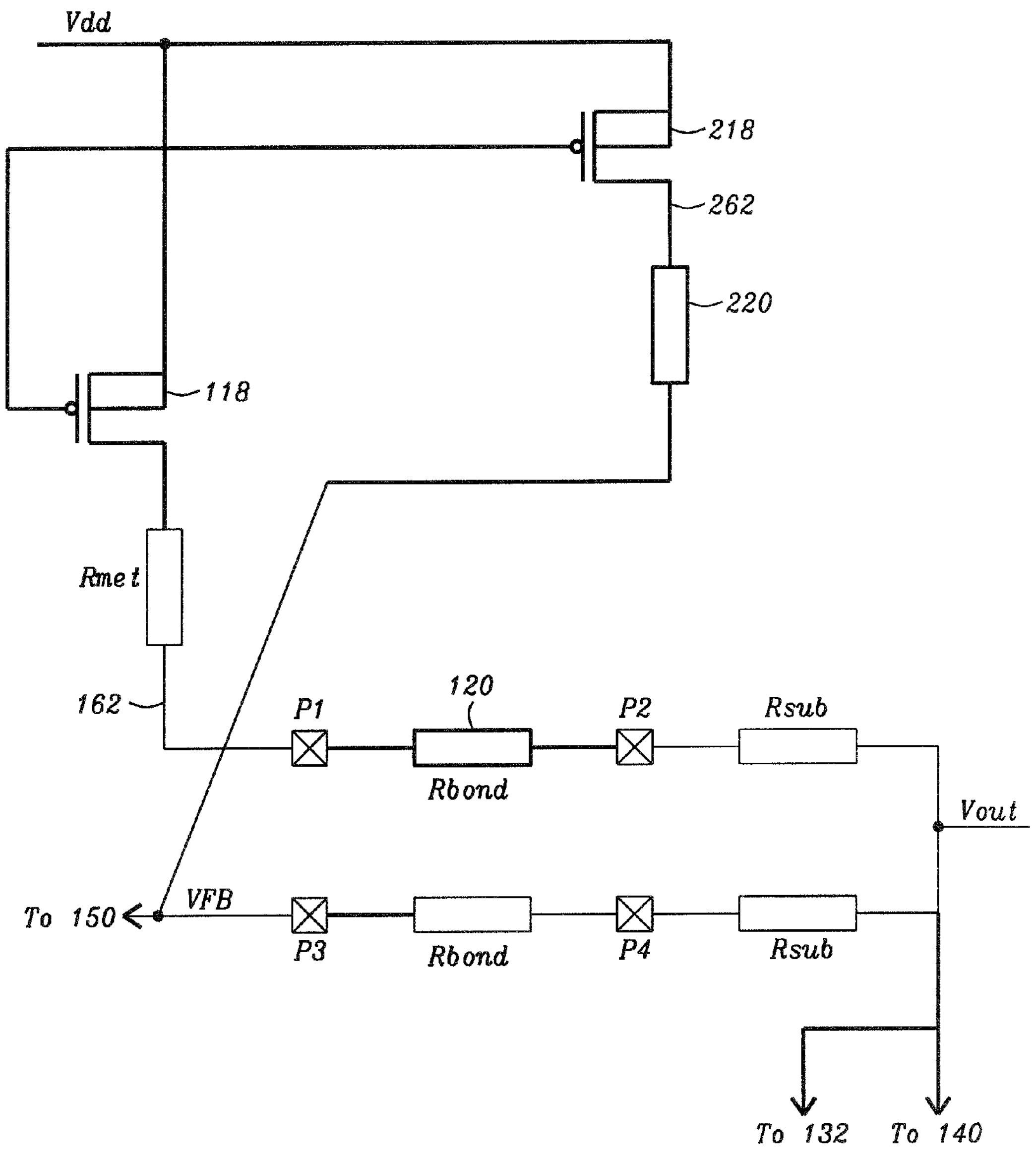
FIG. 3*b* illustrates details of the connection of a small resistor, as shown in FIG. 4*a*, to the fast feedback pad including bond wires and parasitic resistances in the fast feedback loop according to a key point of the present disclosure.

It should be noted that device 220 which is connected in FIG. 4*a* to node 162 should be connected such that it includes as many parasitics (e.g. Rmet, Rbond, and Rsub) as possible within the fast feedback loop. Hence it is especially preferred to connect device 220 to VFB node as shown in FIG. 3*b*.

Figure 4B:
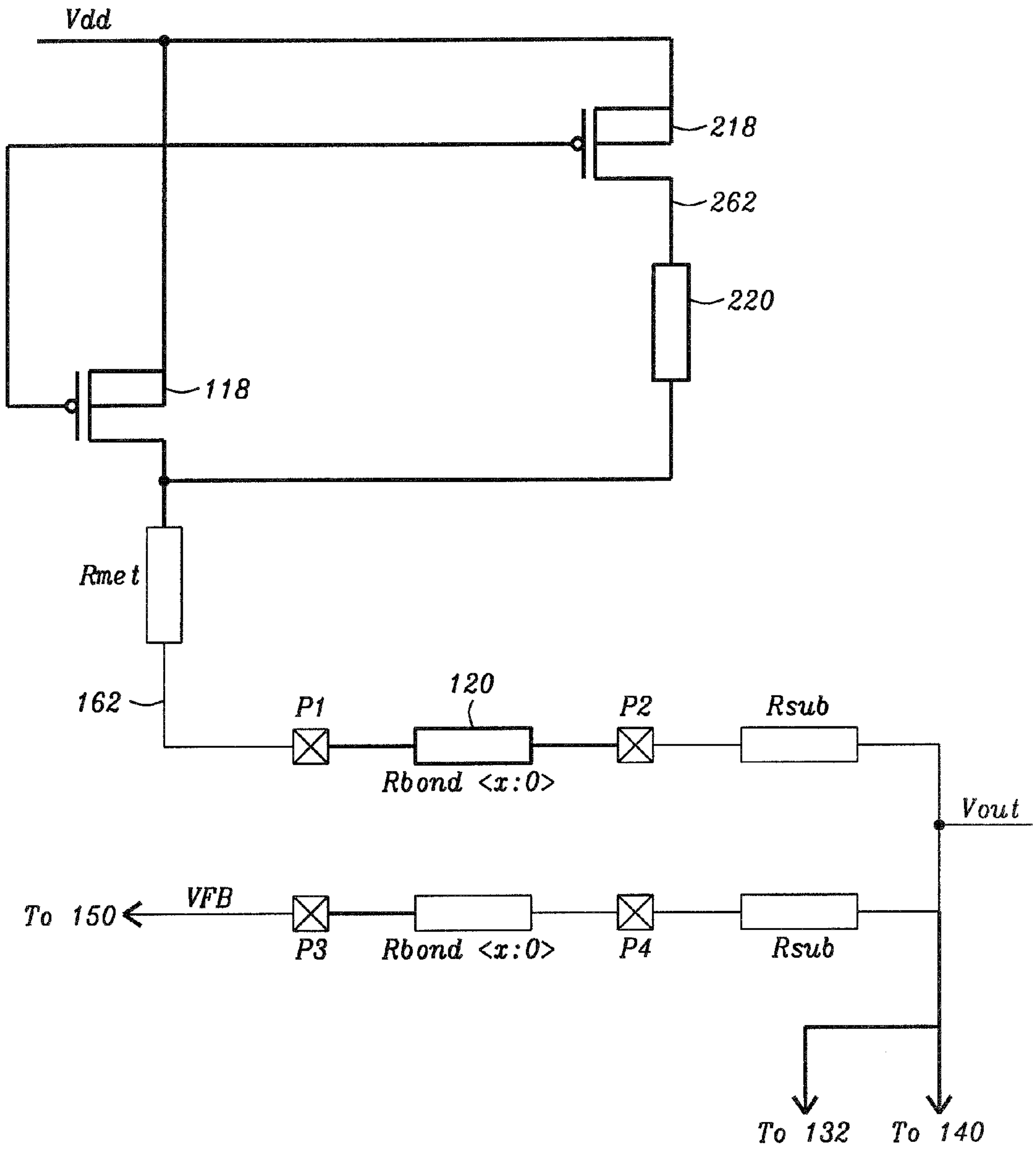
FIG. 4*b* shows in more details the connections of FIG. 4*a* with all parasitic components and bond wires. The metallization resistance of a pass resistor is here in series with a small resistor and is hence not included in the fast loop.

FIG. 4*b* shows in more details the connections of FIG. 4*a* with all parasitic components and bond wires. The metallization resistance Rmet of pass resistor 118 is here in series with resistor 220 and is hence not included in the fast loop.

Figure 4C:
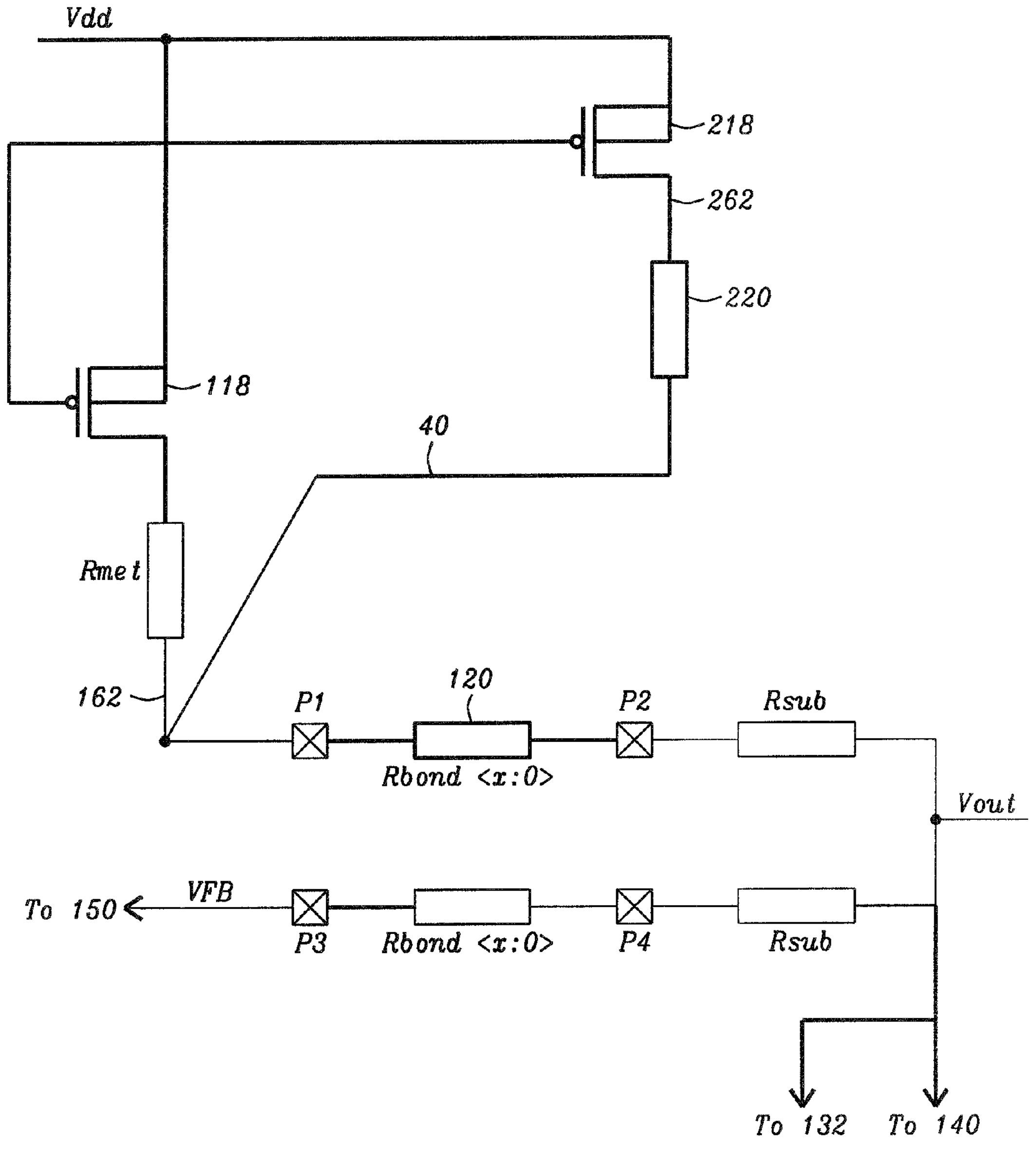
FIG. 4*c* shows again in more details the connections of FIG. 4*a* with all parasitic components and bond wires. In this embodiment the metallization resistance Rmet of the pass resistor is here not in series with the small resistor is hence included in the fast loop.

FIG. 4*c* shows again in more details the connections of FIG. 4*a* with all parasitic components and bond wires. In this embodiment the metallization resistance Rmet of pass resistor 118 is here not in series with resistor 220 is hence included in the fast loop 40.

Returning to FIG. 3*a* the essential features of the new implementation disclosed shown with the example of a LDO are:

Separate pad for feedback (Rbond is connected to node VFB (feedback voltage);

Separate loop for fast loop response of LDO including parasitics; and

Stabilizing circuit within said fast regulation loop

FIG. 3*b* illustrates details of the connection of the small resistor 220, as shown in FIG. 4*a*, to the fast feedback pad including bond wires and parasitic resistances in the fast feedback loop according to a key point of the present disclosure. This would improve the load transient as all the parasitic components are included in the fast loop.

It should be noted that the circuits disclosed are applicable to any numbers of bond wires.

Figure 5:
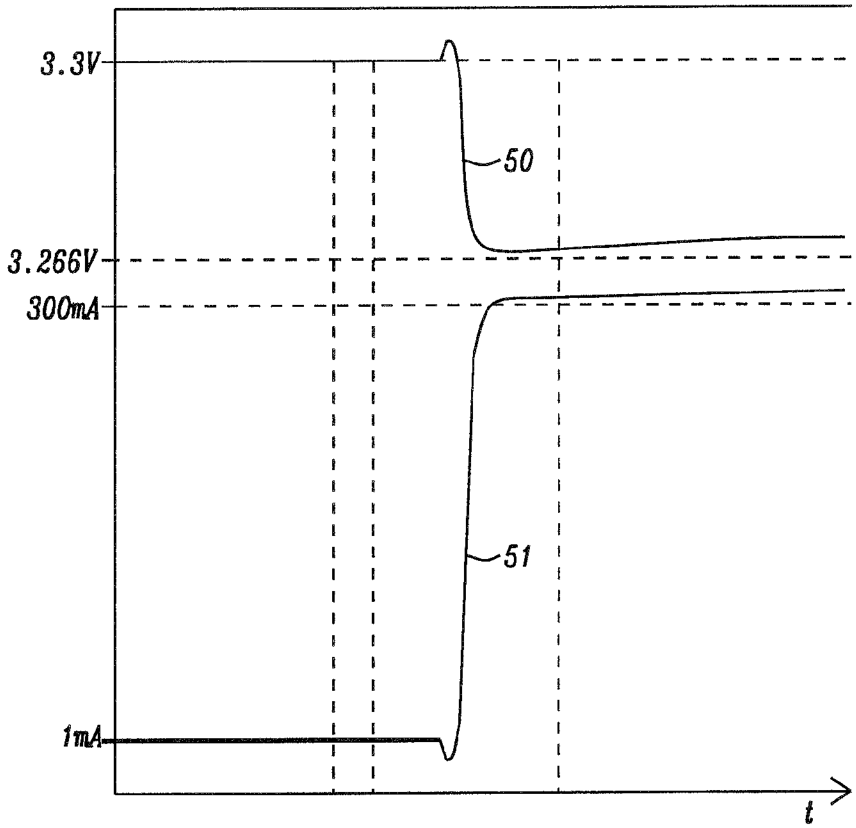
FIG. 5 shows a plot of a LDO response to a load transient from 1 mA to 300 mA according to the circuit design shown in FIG. 3*b*.

FIG. 5 shows a plot of a LDO response to a load transient from 1 mA to 300 mA according to the circuit design shown in FIG. 3*b*. Implementing the modifications of the circuit shown in FIG. 3*b* results in an improvement of 50 mV or 60% compared to the plot of FIG. 2, showing a transient response of 84 mV. The dip in the output voltage 50 to the load transient 51 shown in FIG. 5 from 1 mA to 300 mA is 38.8 mV.

Figure 6:
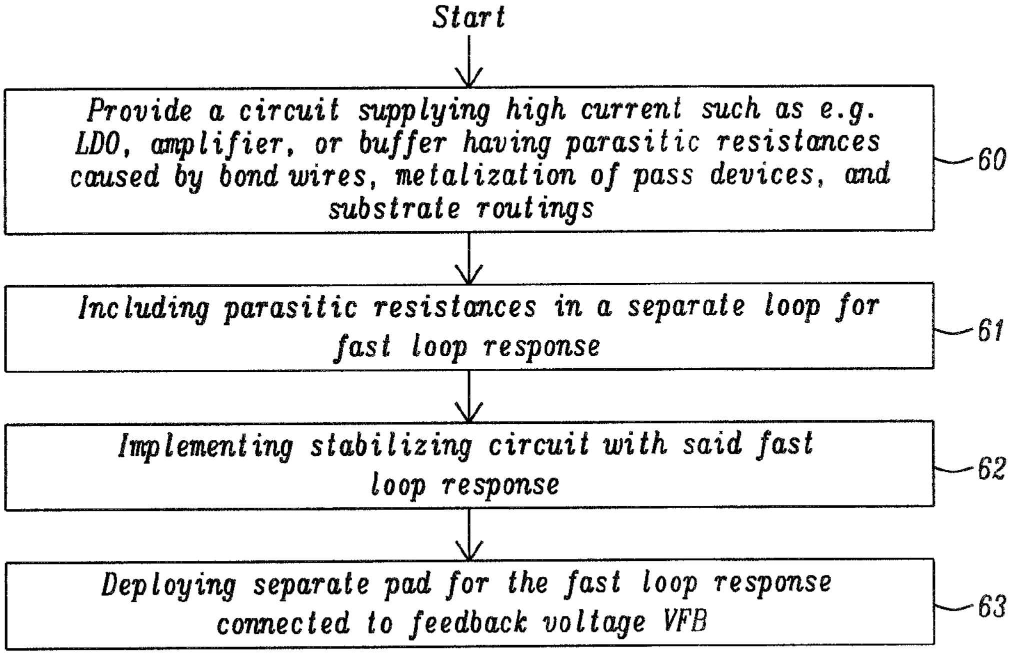
FIG. 6 illustrates a flowchart of a method to improve dynamic load transient performance of circuits supplying high current such as LDOs, amplifiers, or buffers.

FIG. 6 illustrates a flowchart of a method to improve dynamic load transient performance of circuits supplying high current such as LDOs, amplifiers, or buffers.

Step 60 of the method of FIG. 6 illustrates the provision of a circuit as e.g. a LDO, buffer, or amplifier supplying high currents and having parasitic resistances caused by bond wires, metallization of pass devices, and substrate routings. Step 61 depicts including parasitic resistances in a separate loop for fast loop response. Step 32 illustrates implementing stabilizing circuit within said fast loop response. Step 33 shows deploying separate pad for the fast loop response connected to feedback voltage VFB.

While the disclosure has been particularly shown and described with reference to the preferred embodiments thereof, it will be understood by those skilled in the art that various changes in form and details may be made without departing from the spirit and scope of the disclosure.

What is claimed is:

1. A method to improve dynamic load transient performance of circuits supplying high current, comprising the following steps:

(1) providing an electronic circuit supplying high currents and having parasitic resistances and a differential error amplifier, wherein said parasitic resistances comprise resistances of one or more bond wires, metallization of one or more pass devices, and substrate routings;

(2) including parasitic resistances in a separate loop for fast loop response, wherein the separate loop for fast loop response is connected between an output of the differential error amplifier and a separate pad connected to feedback voltage divider VFB;

(3) implementing a stabilizing circuit within said fast loop response, wherein the stabilization circuit is achieved by splitting a main pass device into two unequal parts, namely a smaller part of the pass device and a larger part of the pass device and by placing a controlled impedance in series with the smaller part of the main pass device and including this controlled impedance to the parasitic resistances of the fast loop response; and (4) deploying the separate pad for the fast loop response directly connected to feedback voltage divider VFB.

2. The method of claim 1 wherein said high current comprise a range of more than 200 mA.

3. The method of claim 1 wherein said circuit is a LDO.

4. The method of claim 1 wherein said circuit is an amplifier.

5. The method of claim 1 wherein said circuit is a buffer.

6. The method of claim 1 wherein a resistance of the larger part of the main pass transistor is not included in the loop of fast response.

7. The method of claim 1 wherein one bond wire is used.

8. The method of claim 1 wherein more than one bond wire are used.

9. The circuit of claim 8 wherein the stabilizing circuit comprises a main pass transistor and an additional pass transistor in parallel to the main pass transistor.

10. The circuit of claim 9 wherein a resistive device, having a resistance in a range between about 0.5 to 10 Ω, is deployed between a drain of the additional pass transistor and an output of the circuit.

11. The circuit of claim 10 wherein the resistive device is a resistor.

12. A circuit to improve dynamic load transient performance of circuits supplying high current and having parasitic resistances, comprising:

a differential error amplifier, having inputs and an output, wherein a first input is a reference voltage and a second input is a feedback voltage from a middle node of a voltage divider and the output is connected to gates of pass transistors;

said voltage divider connected between an entry point of the voltage divider via bond resistances to an output voltage of the circuit and ground;

a separate loop for fast transient response including the parasitic resistances wherein the separate loop for fast loop response is connected between an output of the differential error amplifier and a separate pad directly connected to an entry point of the voltage divider, wherein said parasitic resistances comprise resistances of one or more bond wires, metallization of one or more pass devices, and substrate routings;

said separate pad for the loop for fast transient response; and a stabilizing circuit connected to said loop for fast transient response, wherein the stabilization circuit is achieved by splitting a main pass device into two unequal parts, namely a smaller part of the pass device and a larger part of the pass device and by placing a controlled impedance in series with the smaller part of the main pass device and including this controlled impedance to the parasitic resistances of the fast loop response.

13. The circuit of claim 12 wherein said circuit is an LDO.

14. The circuit of claim 12 wherein said circuit is an amplifier.

15. The circuit of claim 12 wherein said circuit is a buffer.

16. The circuit of claim 12 wherein the circuit comprises one bond wire.

17. The circuit of claim 12 wherein the circuit comprises more than one bond wire.

18. The circuit of claim 12 wherein said high current comprise a range of more than 200 mA.

19. The circuit of claim 12 wherein said loop for fast transient response comprises a capacitor.

* * * * *